United States Patent
Salfelner

(10) Patent No.: US 11,971,445 B2
(45) Date of Patent: Apr. 30, 2024

(54) INTEGRATED CIRCUIT AND ASSOCIATED METHOD

(71) Applicant: NXP B.V., Eindhoven (NL)

(72) Inventor: Anton Salfelner, Pernegg (AT)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 17/652,115

(22) Filed: Feb. 23, 2022

(65) Prior Publication Data
US 2022/0308106 A1  Sep. 29, 2022

(30) Foreign Application Priority Data

Mar. 25, 2021 (EP) .................................... 21165003

(51) Int. Cl.
*G01R 31/28* (2006.01)
*G01R 15/16* (2006.01)
*H01L 23/00* (2006.01)

(52) U.S. Cl.
CPC ......... *G01R 31/2856* (2013.01); *G01R 15/16* (2013.01); *H01L 24/48* (2013.01); *H01L 2224/48245* (2013.01); *H01L 2924/1421* (2013.01)

(58) Field of Classification Search
CPC ............ G01R 31/2856; G01R 31/2896; G01R 31/2884; G01R 31/2853; H01L 2224/48245; H01L 2224/49113; H01L 24/48
See application file for complete search history.

(56) References Cited

U.S. PATENT DOCUMENTS

| | | |
|---|---|---|
| 5,726,860 A | 3/1998 | Mozdzen |
| 6,020,631 A | 2/2000 | Mozdzen |
| 6,051,890 A | 4/2000 | Mozdzen |
| 6,493,935 B1 | 12/2002 | Mozdzen |
| 6,731,000 B1 | 5/2004 | Haque et al. |
| 6,798,313 B2 | 9/2004 | Buer |
| 6,835,602 B2 | 12/2004 | Norskov et al. |
| 6,911,739 B1 | 6/2005 | Jin et l. |
| 7,132,359 B2 | 11/2006 | Howard et al. |
| 7,332,814 B2 | 2/2008 | De Beer et al. |
| 7,382,597 B2 | 6/2008 | De Haas |
| 7,550,806 B2 | 6/2009 | De Beer et al. |
| 8,021,973 B2 | 9/2011 | Yao |
| 8,030,763 B2 | 10/2011 | Romero et al. |

(Continued)

FOREIGN PATENT DOCUMENTS

| | | |
|---|---|---|
| CN | 1757167 A | 4/2006 |
| GB | 2351860 A1 | 1/2001 |

(Continued)

OTHER PUBLICATIONS

Baker, N., "Failure Protection in Power Modules with Auxiliary-Emitter Bondwires", PCIM Europe 2018, Jun. 5-7, 2018.

*Primary Examiner* — Dominic E Hawkins

(57) ABSTRACT

The disclosure relates to an integrated circuit and associated method and packaged integrated circuit. The integrated circuit comprises a first pad; a second pad; an active element having a node that is capacitively coupled to the first and second pads; a voltage or current source connected to the first pad; and a detection module connected to the second pad and configured to determine an electrical continuity between the second pad and the first pad.

20 Claims, 5 Drawing Sheets

(56) References Cited

U.S. PATENT DOCUMENTS

| | | |
|---|---|---|
| 8,250,506 B2 | 8/2012 | Bantas |
| 8,664,774 B1 | 3/2014 | Mosinskis |
| 8,769,469 B1 | 7/2014 | Howard et al. |
| 9,435,842 B2 | 9/2016 | Vaucher et al. |
| 10,670,649 B2 | 6/2020 | Michallick et al. |
| 10,845,428 B2 | 11/2020 | Meiser et al. |
| 2004/0089933 A1 | 5/2004 | Haque et al. |
| 2006/0099792 A1 | 5/2006 | Howard et al. |
| 2006/0158815 A1 | 7/2006 | De Haas |
| 2006/0249822 A1 | 11/2006 | De Beer et al. |
| 2008/0099897 A1 | 5/2008 | De Beer et al. |
| 2009/0193370 A1 | 7/2009 | Bantas et al. |
| 2009/0322430 A1 | 12/2009 | Romero et al. |
| 2010/0045328 A1* | 2/2010 | Suto .................. G01R 31/2884 324/754.01 |
| 2011/0006440 A1 | 1/2011 | Yao |
| 2013/0243043 A1* | 9/2013 | Rhee ................. H04B 1/71632 375/147 |
| 2014/0189628 A1 | 7/2014 | Howard et al. |
| 2016/0241024 A1* | 8/2016 | Dupuis .................. H01L 24/49 |
| 2018/0034404 A1 | 2/2018 | Takemura |
| 2018/0315730 A1 | 11/2018 | Gill et al. |
| 2019/0369151 A1 | 12/2019 | Meiser et al. |
| 2020/0025869 A1 | 1/2020 | Chuang et al. |
| 2020/0072891 A1 | 3/2020 | Henmi et al. |
| 2022/0285932 A1* | 9/2022 | Lin ......................... H02H 9/00 |

FOREIGN PATENT DOCUMENTS

| | | |
|---|---|---|
| GB | 2355112 A | 4/2001 |
| JP | 2009147142 A1 | 7/2009 |
| KR | 101860007 B1 | 5/2018 |

\* cited by examiner

INTEGRATED CIRCUIT AND ASSOCIATED METHOD

CROSS-REFERENCE TO RELATED APPLICATIONS

This application claims the priority under 35 U.S.C. § 119 of European Patent application no. 21165003.1, filed on Mar. 25, 2021, the contents of which are incorporated by reference herein.

FIELD

The present disclosure relates to an integrated circuit and associated method, and in particular, although not exclusively, to testing integrated circuits for ultrawideband (UWB) transceivers. The present disclosure further relates to a packaged integrated circuit comprising such an integrated circuit.

BACKGROUND

The RF performance of a packaged integrated circuit comprising a transceiver device can be enhanced by using multiple bondwires to connect the transceiver device to an RF pin. For example, circuit inductance and resistance may be reduced, and reliability may be increased by virtue of the multiple bondwires introducing redundancy into the packaged integrated circuit. Such an arrangement finds application in UWB applications, in which multiple bondwires may be provided at a single input or output in order to improve system performance.

When multiple bondwires are used for a packaged integrated circuit, a problem may arise during fabrication that one bondwire (or, more generally, fewer than the total number of bondwires) has not bonded correctly. This cannot be readily detected during conventional testing for electrically connectivity since an electrical connection (which provides an electrical continuity) is provided by the at least one correctly bonded bondwire. For example, the connection may adequately pass a direct current or a more limited range of frequencies than required for the intended application. Nonetheless, the performance of the packaged integrated circuit may be sub-optimal when in operation in the field.

SUMMARY

According to a first aspect of the present disclosure there is provided an integrated circuit comprising: a first pad; a second pad; an active element having a node that is capacitively coupled to the first and second pads; a voltage or current source connected to the first pad; and a detection module connected to the second pad and configured to determine an electrical continuity between the second pad and the first pad.

In one or more embodiments the integrated circuit comprises self-testing circuitry configured to: supply a voltage or current to the first pad using the voltage or current source; and determine the electrical continuity between the second pad and the first pad using the detection module. The voltage or current may be a direct current, DC, voltage or current.

In one or more embodiments the voltage or current source and/or the detection module comprises a low-pass filter circuit. The low-pass filter circuit may be a resistor-capacitor, RC, filter circuit.

In one or more embodiments the detection module is configured to determine the electrical continuity between the second pad and the first pad based on a measurement of the voltage or current at the second pad meeting a threshold. The level of the voltage or current at the second pad may substantially correspond to the voltage or current provided to the first pad by the voltage or current source.

In one or more the integrated circuit comprises: a first capacitor connected in series between the node of the active element and the first pad; and a second capacitor connected in series between the node of the active element and the second pad. The first capacitor may be connected in series between the node of the active element and the voltage or current source. The second capacitor may be connected in series between the node of the active element and the detection module. The first and second capacitors may be configured to filter out the voltage or current supplied by the voltage or current source to the node of the active element. For example, the impedance of the first and second capacitors may be such that the voltage or current supplied by the voltage or current source is substantially blocked from reaching the node of the active element, or attenuated by at least one of 50%, 90%, 99%, 99.9%. The level of attenuation may be associated with a particular frequency, e.g. 0 Hz for a DC test signal.

In one or more embodiments the integrated circuit comprises at least one additional pad, in which each of the at least one additional pad is capacitively coupled to the node of the active element. At least one additional detection module may be connected to a respective one of the at least one additional pad. Each detection module may be configured to determine an electrical continuity between the respective corresponding additional pad and the first pad.

In one or more embodiments the integrated circuit comprises a first electrostatic discharge, ESD, protection device connected to the first pad. A second ESD protection device may be connected to the second pad. The first ESD device and the second ESD device may comprise a common grounded-gate metal-oxide-semiconductor field-effect transistor, GGMOSFET, and may be implemented as a GGN-MOSFET. The integrated circuit may further comprise at least one additional ESD protection device. Each additional ESD device may be connected to a respective corresponding pad of the at least one additional pad. The first ESD device, the second ESD device and the at least one additional ESD protection device may comprise the common GGMOSFET.

In one or more embodiments the active element is a radio frequency, RF, receiver or transceiver, an ultra-wideband, UWB, transceiver or a Doherty amplifier.

According to a second aspect of the present disclosure there is provided an integrated circuit comprising: the integrated circuit of the first aspect of the disclosure; an external terminal associated with the node of the active element; a first bondwire connecting the first pad to the external terminal; and a second bondwire connecting the second pad to the external terminal.

According to a third aspect of the present disclosure there is provided an method comprising: supplying a voltage or current to a first pad; determining an electrical continuity between the first pad and a second pad, wherein the first pad and the second pad are capacitively coupled to a node of an active element. The method may be a method for testing an integrated circuit having a first pad, a second pad and an active element.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

The above discussion is not intended to represent every example embodiment or every implementation within the scope of the current or future Claim sets. The figures and Detailed Description that follow also exemplify various example embodiments. Various example embodiments may be more completely understood in consideration of the following Detailed Description in connection with the accompanying Drawings.

BRIEF DESCRIPTION OF THE DRAWINGS

One or more embodiments will now be described by way of example only with reference to the accompanying drawings in which.

DETAILED DESCRIPTION

Figure 1:
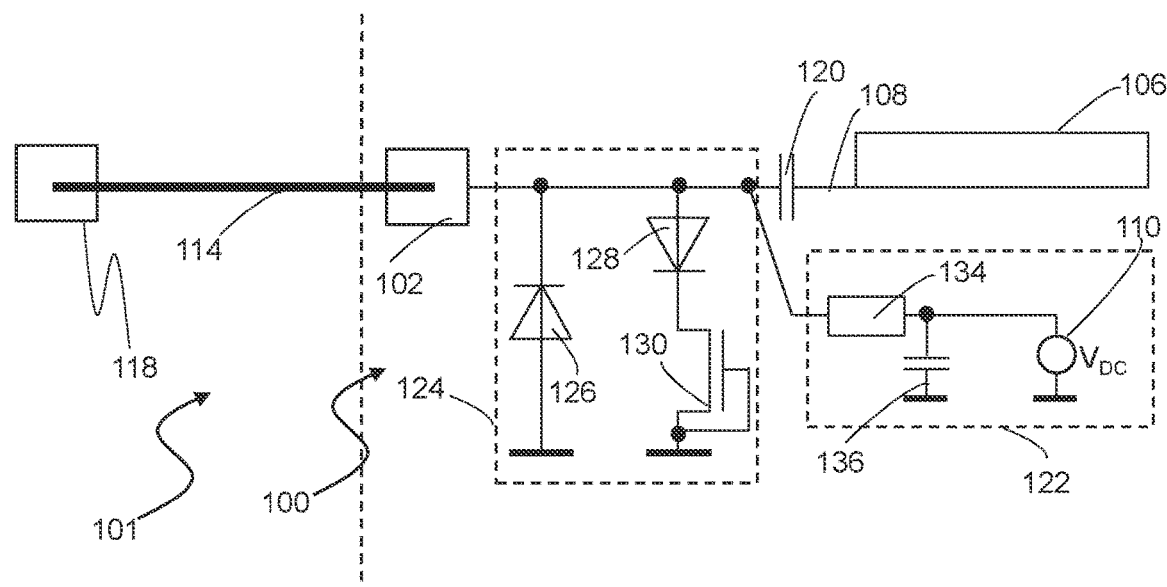
FIG. 1 illustrates a schematic diagram of a conventional integrated circuit package comprising a terminal portion in which a single bond wire is provided between a pin and pad.

FIG. 1 illustrates a schematic diagram of a conventional integrated circuit 100 provided within a packaged integrated circuit 101. In this example, the integrated circuit provides the functionality of an ultrawide band, UWB, transceiver.

The integrated circuit 100 includes an active element 106 with a node 108 that is capacitively coupled to a single pad 102 of the integrated circuit 100 by a decoupling capacitor 120. A DC bias is provided to the pad 102 by a voltage source circuitry 122. Electrostatic discharge, EDS, protection is provided at the pad 102 by EDS protection circuitry 124. The single pad 102 of the integrated circuit 100 is connected to an external terminal 118 of the packaged integrated circuit 101 by a bondwire 114.

In this example, the EDS protection circuitry 124 comprises a first diode 126 connected between the pad 102 and ground, in which the cathode of the diode 126 is connected to the pad 102 and the anode of the diode 126 is connected to ground. The EDS protection circuitry 124 further comprises a second path having a series arrangement of a second diode 128 and a transistor 130 coupled together between the pad 102 and ground. The second diode 128 has an anode connected to the pad and a cathode connected to a source of the transistor, FET, 130. The drain and gate of the transistor 130 are connected to ground.

The voltage source circuitry 122 comprises a voltage source, $V_{DC}$, 110 and a resistor 134 connected between an output of the voltage source 110 and the pad 102. A capacitor 136 is also provided within the voltage source circuitry 122 between the output of the voltage source 110 and ground. The resistor 134 and capacitor 136 together act as a filter.

The arrangement of the packaged integrated circuit 101 means that a break to the bondwire 114 can be detected by testing the electrical conductivity between the single pad 102 and the external terminal 118. Use of a single bondwire 114 may, on the other hand, limit the performance of the packaged integrated circuit 101, as discussed above.

Figure 2:
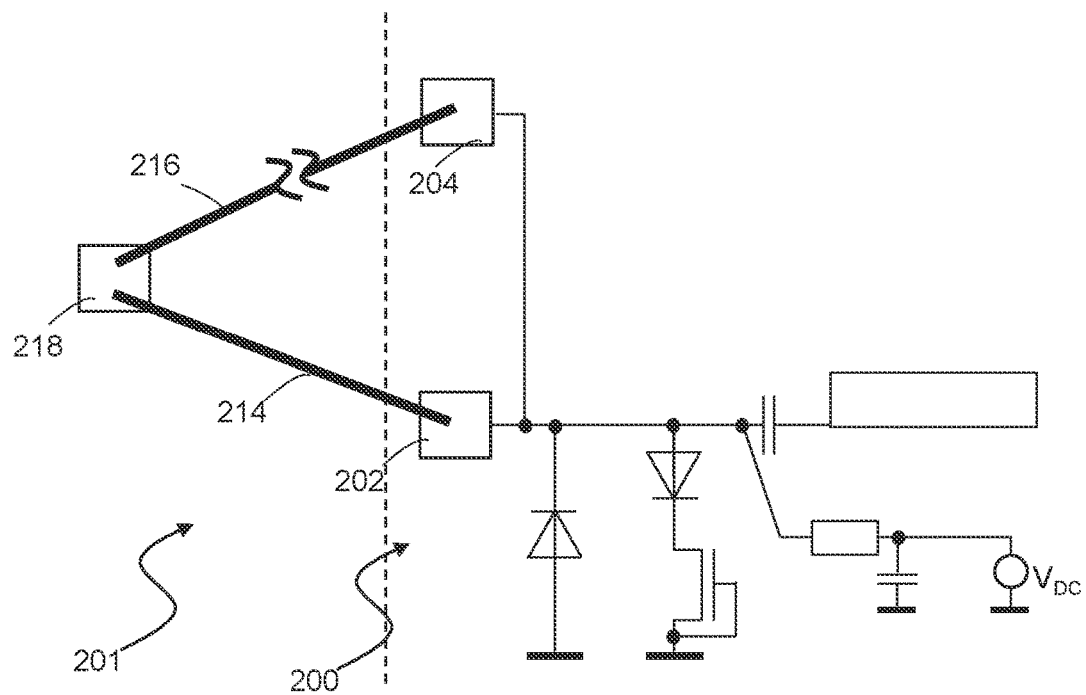
FIG. 2 illustrates a schematic diagram of a conventional integrated circuit package comprising a terminal portion in which two wires is provided between a pin and two pads.

FIG. 2 illustrates a schematic diagram of another example of a packaged integrated circuit 201 providing a two-bondwire connection between an external terminal 218 of the packaged integrated circuit 201 and an integrated circuit 200.

The integrated circuit 200 is substantially the same as that described previously with reference to FIG. 1 except that instead of a single pad, the integrated circuit 200 has a first pad 202 and a second pad 204. The first pad 202 is connected to the second pad 204 within the integrated circuit 200.

A first bond wire 214 connects the first pad 202 to the external terminal 218. A second bond wire 216 connects the second pad 204 to the external terminal 218. In this example, there is a break in the second bond wire 216.

Compared to the packaged integrated circuit of FIG. 1, the arrangement of the packaged integrated circuit 201 of FIG. 2 affords improved active element performance, for example through a lower series resistance. On the other hand, testing the electrical conductivity between the second pad 204 and the external terminal 218 cannot readily detect the break: an electrical continuity between the second pad 204 and the external terminal 218 is otherwise achieved via the first pad 202.

Figure 3A:
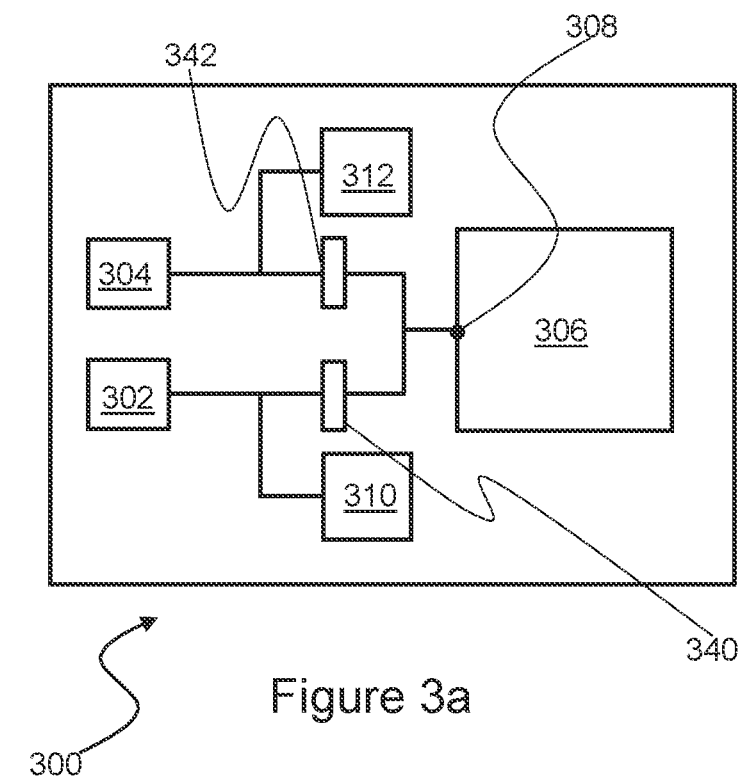
FIG. 3a illustrates a schematic diagram of an integrated circuit according to an aspect of the disclosure.

FIG. 3a illustrates an integrated circuit 300 according to an aspect of the disclosure. The integrated circuit 300 comprises a first pad 302, a second pad 304, and an active element 306. The active element 306 may be a radio frequency, RF, receiver or transceiver, an ultra-wideband, UWB, transceiver or a Doherty amplifier, for example.

The active element 306 has a node 308 that is capacitively coupled to the first and second pads 302, 304. In addition, the integrated circuit 300 comprises a voltage or current source 310 connected to the first pad 302, and a detection module 312. The detection module 312 is connected to the second pad 304 and configured to determine an electrical continuity between the second pad 304 and the first pad 302.

The integrated circuit 300 may further comprise self-testing circuitry configured to supply a voltage or current to the first pad 302 using the voltage or current source 310 and determine the electrical continuity between the second pad 304 and the first pad 302 using the detection module 312. The voltage or current may be a direct current, DC, voltage or current.

The detection module 312 may be configured to determine the electrical continuity between the second pad 304 and the first pad 302 based on a measurement of the voltage or current at the second pad 304 meeting a threshold. For example, the level of the voltage or current at the second pad 304 may substantially correspond to the voltage or current provided to the first pad 302 by the voltage or current source 310.

The integrated circuit 300 may further comprise a first coupling 340 and a second coupling 342. The first coupling 340 is provided in series between the node 308 of the active element 306 and the first pad 302. The second coupling 342 is provided in series between the node of the active element 308 and the second pad 304. The first coupling 340 is connected in series between the node 308 of the active element 306 and the voltage or current source 310. The second coupling 342 is connected in series between the node 308 of the active element 308 and the detection module 312. The first and second coupling 340, 342 are configured to filter out the voltage or current supplied by the voltage or current source 310 to the node 308 of the active element 306.

The first and second couplings 340, 342 may be provided as capacitive couplings using, for example, capacitors. For example, an impedance of the first and second couplings 340, 342 may be such that the voltage or current supplied by the voltage or current source 310 is substantially blocked from reaching the node 308 of the active element 306, or attenuated by at least one of 50%, 90%, 99%, 99.9%.

The integrated circuit 300 may further comprise at least one additional pad, in which each of the at least one additional pad is capacitively coupled to the node 308 of the active element 306, and at least one additional detection module is connected to a respective one of the at least one additional pad. In such examples, each detection module may be configured to determine an electrical continuity between the respective corresponding additional pad and the first pad 302.

The integrated circuit 300 may further comprise a first electrostatic discharge, ESD, protection device connected to the first pad, and a second ESD protection device connected to the second pad. The first ESD device and the second ESD device may comprise a common grounded-gate metal-oxide-semiconductor field-effect transistor, GGMOSFET. The integrated circuit 300 may further comprise least one additional ESD protection device, in which each additional ESD device is connected to a respective corresponding pad of the at least one additional pad. The first ESD device, the second ESD device and the at least one additional ESD protection device may comprise the common GGMOSFET.

Figure 3B:
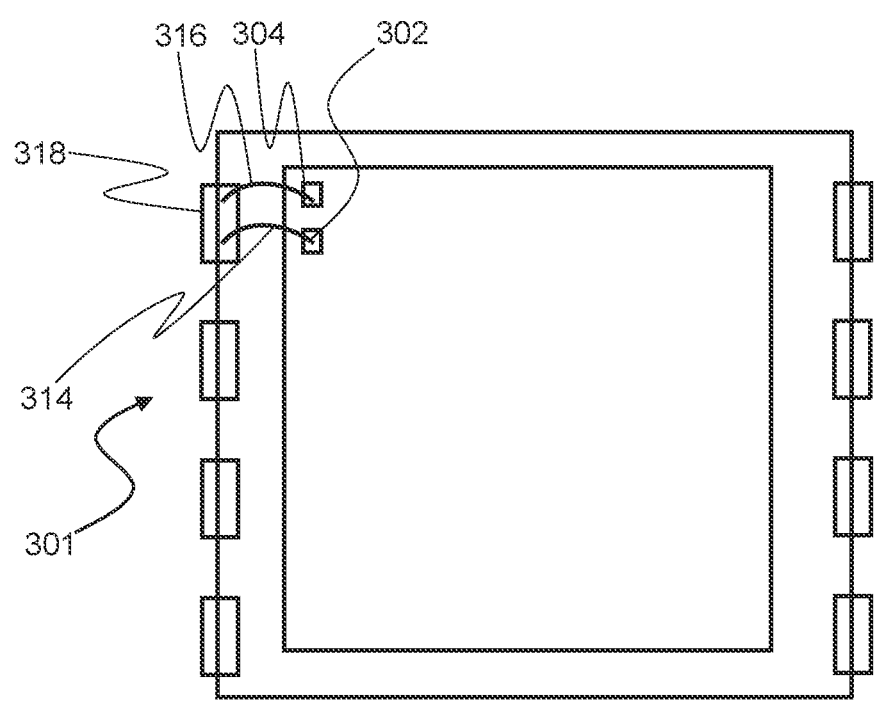
FIG. 3b illustrates a schematic diagram of a packaged integrated circuit according to an aspect of the disclosure.

FIG. 3b illustrates a packaged integrated circuit 301 according to an aspect of the disclosure. The packaged integrated circuit 301 comprises an integrated circuit according to FIG. 3a. For clarity, only the first pad 302 and the second pad 304 of the integrated circuit are shown. The packaged integrated circuit further comprises an external terminal 318 associated with the node of the active element, a first bondwire 314 connecting the first pad 302 to the external terminal 318, and a second bondwire 316 connecting the second pad 304 to the external terminal 318. The external terminal 318 may be provided by a pin of the packaged integrated circuit 301.

Figure 4:
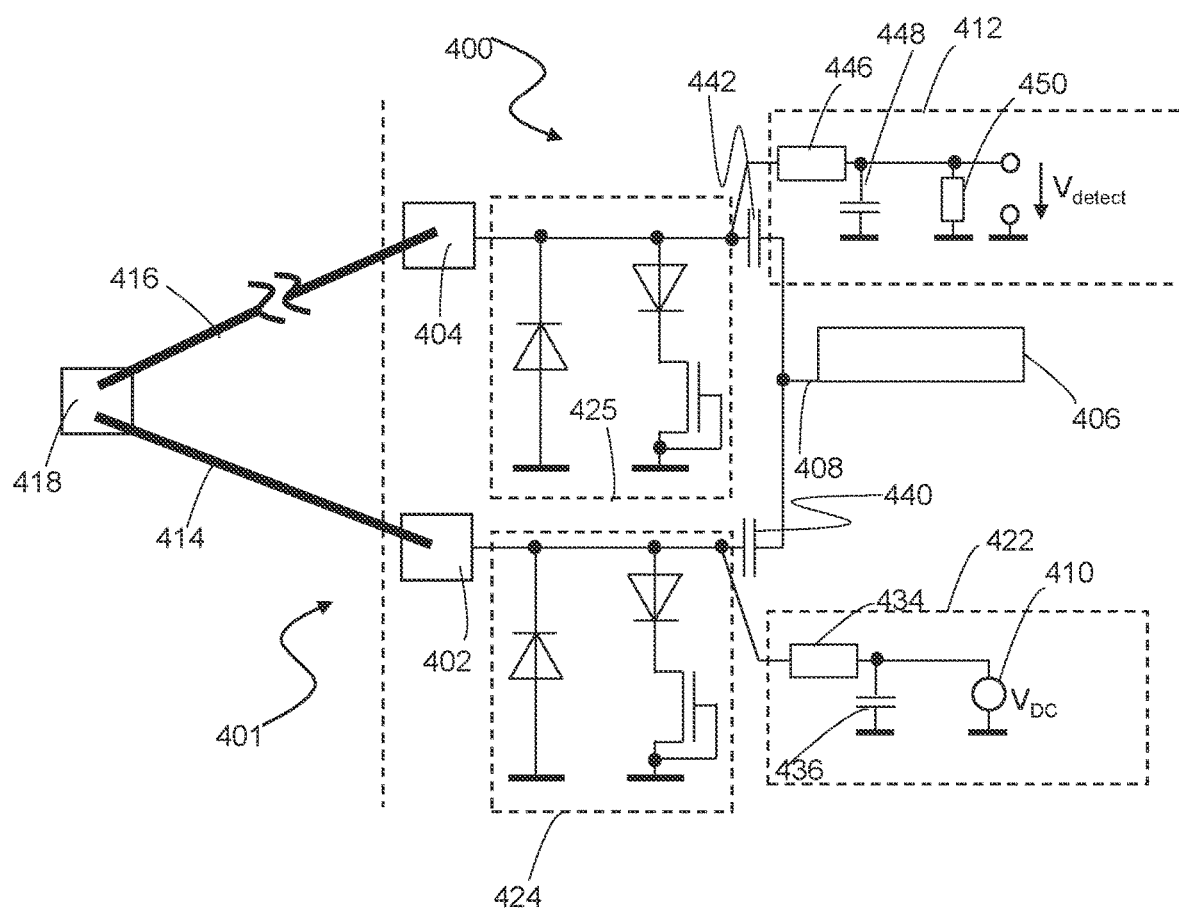
FIG. 4 illustrates a schematic diagram of a portion of an integrated circuit package according to the aspect of the disclosure.

FIG. 4 illustrates a schematic of a packaged integrated circuit 401 comprising an integrated circuit 400. The integrated circuit 400 comprises an active element 406 with a node 408. The node 408 of the active element 406 is associated with a first pad 402 and a second pad 404. In this example, the node 404 of the active element 406 is capacitively coupled to the first pad 402 by a first capacitor 442. The node 408 of the active element 406 is also capacitively coupled to the second pad 404 by a second capacitor 440.

The connection between the integrated circuit 400 and an external terminal 418 is similar to that described previously with reference to FIG. 3b in that the first pad 402 is connected to the external terminal 418 by a first bond wire 414 and the second pad 404 is connected to the external terminal 418 by a second bond wire 416.

Also as described previously with reference to FIG. 3a, the integrated circuit 400 comprises a voltage source 410 connected to the first pad 402 and a detection module 412 connected to the second pad 404.

The voltage source 410 may be provided by voltage source circuitry 422 such as that described previously with reference to FIG. 1. The voltage or current source 410 may comprise a low-pass filter circuit. The low-pass filter circuit may be a resistor-capacitor, RC, filter circuit provided by a resistor 434 and a capacitor 436 in series between the second pad 402 and ground.

The first capacitor 442 acts as a decoupling element so that a voltage provided by the voltage source 410 (e.g., a voltage, $V_{DC}$, of 2V) is not passed directly to the node 408 of the active element 406. Instead, the voltage provided by the voltage source 410 is provided to the first pad 402.

The detection module 412 comprises a first resistor 446 connected in series between the second pad 404 and a low pass filter provided by a capacitor 448 and a second resistor 450. The capacitor 448 and the second resistor 450 are connected in parallel between the first resistor 446 and ground. A voltage across the second resistor 450 provides a detected voltage of the detection module 412. The voltage may be processed by conventional analogue-to-digital conversion circuitry within a built-in self-test (BIST) module of the integrated circuit 400.

The detection module 412 is configured to determine an electrical continuity between the second pad 404 and the first pad 402 based on a measurement of the voltage, $V_{detect}$, at the second pad meeting a threshold. In this way, the first and second bond wires 414, 416 provide an electrical conduction path between the first pad 402 and the second pad 404 via the external terminal 418. The voltage provided by the voltage source 410 is detectable by the detection module 412 connected to the second pad 404 only if the first and second bond wires provide an unbroken electrical path.

As with the example described previously with respect to FIG. 3, the integrated circuit 400 of FIG. 4 may, therefore, provide an advantage over the integrated circuits illustrated in FIGS. 1 and 2 since enhanced active element performance can be achieved without losing the ability to detect individual broken bondwires.

In this example, first electrostatic discharge (EDS) protection circuitry 424 is connected to the first pad and second EDS protection circuitry 425 is connected to the second pad 404. The first and second EDS protection circuitry may each be provided by the EDS protection circuitry described previously with reference to FIG. 1.

Figure 5:
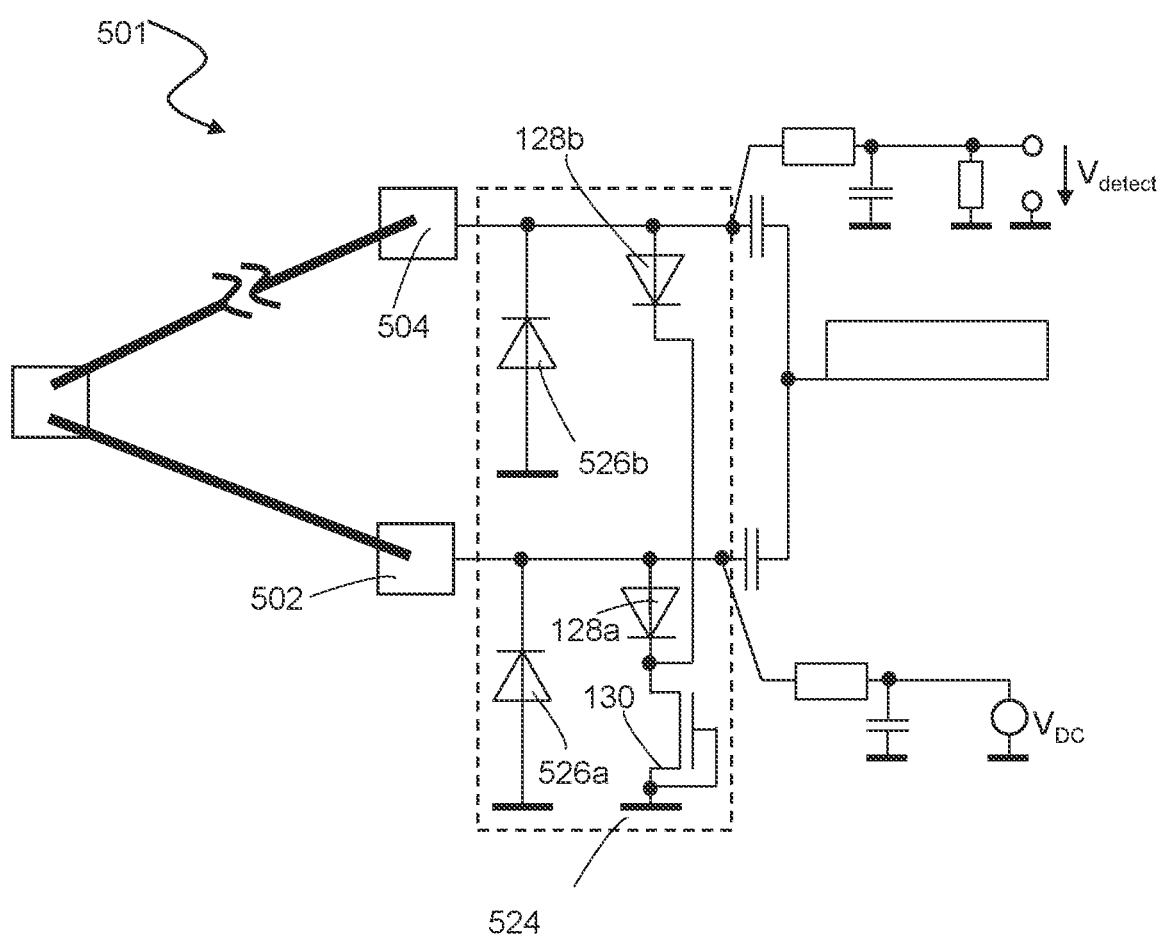
FIG. 5 illustrates a schematic diagram of a further example of an integrated circuit package according to the disclosure.

FIG. 5 illustrates a schematic of a further example of an integrated circuit package 501. The integrated circuit package 501 is similar to that described previously with reference to FIG. 4 except that the first and second ESD protection circuitry has been replaced by common ESD protection circuitry 524.

The common ESD protection circuitry 524 comprises a first diode 526a and a second diode 526b. The first diode 526a has a cathode connected to the first pad 502 and an anode connected to ground. The second diode 526b has a cathode connected to the second pad 504 and an anode connected to ground. The common ESD protection circuitry 524 further comprises a third diode 128a, a fourth diode 128b and a transistor 130. The third diode 128a has an anode connected to the first pad 502 and a cathode connected to a source of the transistor 130. The fourth diode 128b has an anode connected to the second pad 504 and a cathode connected to the source of the transistor. A drain and a gate of the transistor 130 are connected to ground.

Opting for a single transistor 130—contrast with the first and second EDS protection circuitry illustrated in FIG. 4—reduces the area requirements of the common ESD protection circuitry 524 and provides for shared ESD triggering.

Figure 6:
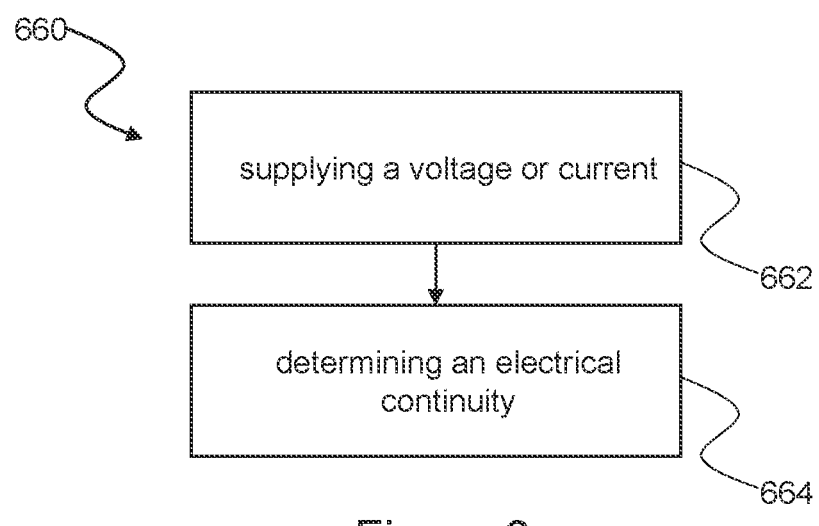
FIG. 6 illustrates a method for testing an integrated circuit.

FIG. 6 illustrates a method for testing an integrated circuit such as, for example, the integrated circuits discussed previously with reference to FIGS. 3 to 5. The integrated circuit may having a first pad, a second pad and an active element, and the first pad and the second pad may be capacitively coupled to a node of the active element. The method 660 comprises supplying 662 a voltage or current to the first pad, and determining 664 an electrical continuity between the first pad and the second pad. The determination 664 may be based on a current or voltage measured or detected at the second pad.

The instructions and/or flowchart steps in the above figures can be executed in any order, unless a specific order is explicitly stated. Also, those skilled in the art will recognize that while one example set of instructions/method has been discussed, the material in this specification can be combined in a variety of ways to yield other examples as well, and are to be understood within a context provided by this detailed description.

In some example embodiments the set of instructions/method steps described above are implemented as functional and software instructions embodied as a set of executable instructions which are effected on a computer or machine which is programmed with and controlled by said executable instructions. Such instructions are loaded for execution on a processor (such as one or more CPUs). The term processor includes microprocessors, microcontrollers, processor modules or subsystems (including one or more microprocessors or microcontrollers), or other control or computing devices. A processor can refer to a single component or to plural components.

In other examples, the set of instructions/methods illustrated herein and data and instructions associated therewith are stored in respective storage devices, which are implemented as one or more non-transient machine or computer-readable or computer-usable storage media or mediums. Such computer-readable or computer usable storage medium or media is (are) considered to be part of an article (or article of manufacture). An article or article of manufacture can refer to any manufactured single component or multiple components. The non-transient machine or computer usable media or mediums as defined herein excludes signals, but such media or mediums may be capable of receiving and processing information from signals and/or other transient mediums.

Example embodiments of the material discussed in this specification can be implemented in whole or in part through network, computer, or data based devices and/or services. These may include cloud, internet, intranet, mobile, desktop, processor, look-up table, microcontroller, consumer equipment, infrastructure, or other enabling devices and services. As may be used herein and in the claims, the following non-exclusive definitions are provided.

In one example, one or more instructions or steps discussed herein are automated. The terms automated or automatically (and like variations thereof) mean controlled operation of an apparatus, system, and/or process using computers and/or mechanical/electrical devices without the necessity of human intervention, observation, effort and/or decision.

It will be appreciated that any components said to be coupled may be coupled or connected either directly or indirectly. In the case of indirect coupling, additional components may be located between the two components that are said to be coupled.

In this specification, example embodiments have been presented in terms of a selected set of details. However, a person of ordinary skill in the art would understand that many other example embodiments may be practiced which include a different selected set of these details. It is intended that the following claims cover all possible example embodiments.

The invention claimed is:

1. An integrated circuit comprising:
a first pad;
a second pad;
an active element having a node that is capacitively coupled to the first and second pads;
a voltage or current source connected to the first pad; and
a detection module connected to the second pad and configured to determine an electrical continuity between the second pad and the first pad;
a first capacitor connected in series between the node of the active element and the first pad; and
a second capacitor connected in series between the node of the active element and the second pad.

2. The integrated circuit of claim 1, comprising self-testing circuitry configured to:
supply a voltage or current to the first pad using the voltage or current source; and
determine the electrical continuity between the second pad and the first pad using the detection module.

3. The integrated circuit of claim 2, wherein the voltage or current is a direct current, DC, voltage or current.

4. The integrated circuit of claim 1, wherein the voltage or current source and/or the detection module comprises a low-pass filter circuit.

5. The integrated circuit of claim 1, wherein the detection module is configured to determine the electrical continuity between the second pad and the first pad based on a measurement of the voltage or current at the second pad meeting a threshold.

6. The integrated circuit of claim 1, in which:
the first capacitor is connected in series between the node of the active element and the voltage or current source; and
the second capacitor is connected in series between the node of the active element and the detection module.

7. The integrated circuit of claim 1, wherein the first and second capacitors are configured to filter out the voltage or current supplied by the voltage or current source to the node of the active element.

8. The integrated circuit of claim 1, in which the active element is a radio frequency, RF, receiver or transceiver, an ultra-wideband, UWB, transceiver or a Doherty amplifier.

9. A packaged integrated circuit comprising:
the integrated circuit of claim 1;
an external terminal associated with the node of the active element;
a first bondwire connecting the first pad to the external terminal; and
a second bondwire connecting the second pad to the external terminal.

10. The integrated circuit of claim 1, comprising:
a first electrostatic discharge, ESD, protection device connected to the first pad; and
a second ESD protection device connected to the second pad.

11. An integrated circuit comprising:
a first pad;
a second pad;
an active element having a node that is capacitively coupled to the first and second pads;
a voltage or current source connected to the first pad; and a detection module connected to the second pad and configured to determine an electrical continuity between the second pad and the first pad;

at least one additional pad, in which each of the at least one additional pad is capacitively coupled to the node of the active element; and at least one additional detection module connected to a respective one of the at least one additional pad, in which each detection module is configured to determine an electrical continuity between the respective corresponding additional pad and the first pad.

12. The integrated circuit of claim 11, comprising:
a first capacitor connected in series between the node of the active element and the first pad; and
a second capacitor connected in series between the node of the active element and the second pad.

13. The integrated circuit of claim 11 in which: the first capacitor is connected in series between the node of the active element and the voltage or current source; and the second capacitor is connected in series between the node of the active element and the detection module.

14. A packaged integrated circuit comprising:
the integrated circuit of claim 11;
an external terminal associated with the node of the active element;
a first bondwire connecting the first pad to the external terminal; and
a second bondwire connecting the second pad to the external terminal.

15. An integrated circuit comprising:
a first pad;
a second pad;
an active element having a node that is capacitively coupled to the first and second pads;
a voltage or current source connected to the first pad; and
a detection module connected to the second pad and configured to determine an electrical continuity between the second pad and the first pad;
a first electrostatic discharge, ESD, protection device connected to the first pad; and
a second ESD protection device connected to the second pad.

16. The integrated circuit of claim 15, wherein the first ESD device and the second ESD device comprise a common grounded-gate metal-oxide-semiconductor field-effect transistor, GGMOSFET.

17. The integrated circuit of claim 15, comprising at least one additional ESD protection device, in which each additional ESD device is connected to a respective corresponding pad of the at least one additional pad.

18. The integrated circuit of claim 15, comprising:
at least one additional pad, in which each of the at least one additional pad is capacitively coupled to the node of the active element; and
at least one additional detection module connected to a respective one of the at least one additional pad, in which each detection module is configured to determine an electrical continuity between the respective corresponding additional pad and the first pad.

19. A packaged integrated circuit comprising:
the integrated circuit of claim 15;
an external terminal associated with the node of the active element;
a first bondwire connecting the first pad to the external terminal; and
a second bondwire connecting the second pad to the external terminal.

20. A method for testing an integrated circuit having a first pad, a second pad and an active element, the method comprising:
supplying a voltage or current to the first pad;
determining an electrical continuity between the first pad and the second pad,
wherein the first pad and the second pad are capacitively coupled to a node of the active element;
wherein a first capacitor is connected in series between the node of the active element and the first pad; and
wherein a second capacitor is connected in series between the node of the active element and the second pad.

* * * * *